(12) United States Patent
Kim et al.

(10) Patent No.: US 12,259,405 B2
(45) Date of Patent: Mar. 25, 2025

(54) ADJUSTMENT CONTROL DEVICE FOR PRECISE MEASUREMENT

(71) Applicant: PAMTEK Co., Ltd., Hwaseong-si (KR)

(72) Inventors: Jae Woong Kim, Hwaseong-si (KR); Jung In Park, Hwaseong-si (KR); Sung Gu Kim, Hwaseong-si (KR); Hee Tae Kim, Hwaseong-si (KR)

(73) Assignee: PAMTEK Co., Ltd., Hwaseong-do (KR)

( * ) Notice: Subject to any disclaimer, the term of this patent is extended or adjusted under 35 U.S.C. 154(b) by 282 days.

(21) Appl. No.: 18/083,539

(22) Filed: Dec. 18, 2022

(65) Prior Publication Data

US 2023/0366911 A1    Nov. 16, 2023

(30) Foreign Application Priority Data

May 10, 2022 (KR) .................. 10-2022-0057355

(51) Int. Cl.
  *G01R 1/067*    (2006.01)
  *F16M 11/20*    (2006.01)
  *F16M 11/24*    (2006.01)

(52) U.S. Cl.
  CPC ..... *G01R 1/06705* (2013.01); *F16M 11/2014* (2013.01); *F16M 11/2021* (2013.01); *F16M 11/2085* (2013.01); *F16M 11/2092* (2013.01); *F16M 11/24* (2013.01); *F16M 2200/027* (2013.01)

(58) Field of Classification Search
  CPC ...... F16M 11/20; F16M 11/24; F16M 11/048; F16M 11/2014; F16M 11/2021; F16M 11/2057; F16M 11/2064; F16M 11/2071; F16M 11/2085; F16M 11/2092; F16M 2200/027; G01R 1/067; G01R 1/06705; G01B 11/26; G01N 21/8806; G01N 21/9501; G01N 2021/8835; G01N 2201/1047
  USPC ..................................... 324/750.22
  See application file for complete search history.

(56) References Cited

FOREIGN PATENT DOCUMENTS

| CN | 204083710 U | 1/2015 |
|---|---|---|
| CN | 107748446 A | 3/2018 |
| CN | 109901269 A | 6/2019 |

(Continued)

OTHER PUBLICATIONS

Espacenet English translation of CN 110319311 A (Year: 2019).*
English translation of CN 214666647 U (Year: 2021).*

*Primary Examiner* — Alesa Allgood
*Assistant Examiner* — Courtney G McDonnough
(74) *Attorney, Agent, or Firm* — Tucker Ellis LLP

(57) ABSTRACT

An adjustment control device for precise measurement that controls an inspection equipment for inspecting an inspected object to perform precise measurement includes a lowering control unit that lowers the inspection equipment with respect to the inspected object, a rotation control unit that is coupled to the lowering control unit and that controls the lowering control unit to rotate the inspection equipment at a predetermined angle in left and right directions when viewed from a frontal point of view, and a forward and backward control unit that is disposed above the rotation control unit and that transmit a moving force to the rotation control unit to move the inspection equipment forward or forward on the inspected object.

9 Claims, 10 Drawing Sheets

(56) References Cited

FOREIGN PATENT DOCUMENTS

| | | | | |
|---|---|---|---|---|
| CN | 110319311 A | * | 10/2019 | ........... F16M 11/045 |
| CN | 210089635 U | | 2/2020 | |
| CN | 214666647 U | * | 11/2021 | ............. G01B 11/06 |
| CN | 215727772 U | | 2/2022 | |
| KR | 10-0292610 B1 | | 1/2002 | |
| KR | 102300468 B1 | | 9/2021 | |

* cited by examiner

ADJUSTMENT CONTROL DEVICE FOR PRECISE MEASUREMENT

RELATED APPLICATION DATA

This application claims the benefit of Korean Patent Application No. KR 10-2022-0057355, filed May 10, 2022, the content of which is incorporated herein by reference in its entirety.

BACKGROUND OF THE INVENTION

1. Technical Field

The present invention relates to an adjustment control device for precise measurement. More specifically, the present invention relates to an adjustment control device which can adjust the inspection equipment at various angles such as forward, backward, left and right directions on an inspected object, and can precisely measure the horizontality of the inspected object or can precisely perform a vision test, while precisely adjusting the distance between the inspection equipment and the inspected object.

2. Description of the Related Art

In general, FPCB (Flexible Printed Circuit Board, hereinafter, referred to as "FPCB") is manufactured through a process similar to that of semiconductor, and is manufactured by arranging and producing a plurality of identical products on one sheet and then cutting and separating them, and the vision test will check for abnormalities.

In addition, due to the development of the electronic industry, electronic products are gradually miniaturized and refined.

In accordance with this trend, the use of thin and durable flexible printed circuit boards for internal circuits of electronic products is gradually increasing, and these FPCBs are also gradually becoming smaller in size and increasing the mounting density of devices.

In addition, the mobile phone is equipped with a built-in camera module having a function of taking a still image of an object and storing or transmitting the image.

In a conventional camera module built into a mobile phone, a lens housing having an FPCB and a camera lens and a connector are connected by a flexible printed circuit board (FPCB).

On the other hand, the camera module having such a structure is shipped after being seated on an inspection jig, measuring horizontality through inspection equipment, or performing a vision test.

Therefore, there is an urgent need to develop equipment capable of precisely measuring or inspecting the camera module by precisely controlling the inspection equipment at various angles on the camera module or by precisely adjusting the distance between the inspection equipment and the camera module.

PRIOR ART DOCUMENT (Patent Document 1) Korean Patent No. 10-0292610 (Mar. 26, 2001)

SUMMARY OF THE INVENTION

The present invention has been made to solve the problems of the prior art. The purpose of the present invention is to provide an adjustment control device for precise measurement that can accurately measure the horizontality of an inspected object or that can precisely perform a vision test while precisely adjusting the inspection equipment at various angles such as the front, back, left, and right directions on the inspected object, and accurately controlling the distance between the inspection equipment and the inspected object.

The adjustment control device for precise measurement according to one embodiment of the present invention relates to a device for controlling an inspection equipment for inspecting an object to be inspected to perform precise measurement, comprising: a lowering control unit lowering the inspection equipment with respect to the inspected object; a rotation control unit being coupled to the lowering control unit and controlling the lowering control unit to rotate the inspection equipment at a predetermined angle in left and right directions when viewed from a frontal point of view; a forward and backward control unit being disposed above the rotation control unit and transmitting a moving force to the rotation control unit to move the inspection equipment forward or forward on the inspected object.

Further, the lowering control unit comprises an elevation member being fixed to a bracket to which the inspection equipment is fixed, and including an elevation member having a lowering push piece on one side and an elevation guide member for guiding elevation of the elevation member, wherein the elevation member and the elevation guide member are provided with at least one or more of a rail groove and a slide bar for guiding elevation, respectively; and a lowering actuation unit secured to the elevation member and pressing the lowering push piece while varying its length to lower the inspection equipment to the inspected object.

In addition, the lowering control unit further comprises a first holding portion for holding the elevation member, and wherein the first holding portion comprises a first coupling member secured to the elevation member, including a contact region contacting to the elevation guild member, and having a spiral hole for holding on the contact region, a first holding member coupling to the spiral hole of the first coupling member and pressing the elevation guide member to secure the elevation member, and a first guild member coupling the elevation guide member, and having a movement guide long hole for guiding movement of the first holding member.

And, the rotation control unit comprises a rotation body secured to one surface of the lowering control unit, and being capable of being rotated in the left and right directions together with the lowering control unit, when viewed from the frontal point of view; a rotation operation piece coupled to one end of the rotation body, and being provided for operating the rotation motion of the rotation body; a rotation guide housing including a rotation guide groove in which the rotation body is accommodated and rotated, and a rotation long hole for allowing a limited horizontal movement distance of the rotation operation piece to be coupled the rotation guide groove on the bottom surface; and a pair of rotation actuation unit being coupled to the bottom surface of the rotation guide housing, facing each other with the rotation operation piece interposed therebetween, and pushing the rotation operation piece to rotate the rotation body at a predetermined angle in the left or right direction.

Further, the present invention further comprises a tilting type forward and backward control unit being disposed above the rotation control unit and controlling the rotation control unit to move the inspection equipment forward and backward while tilting the inspection equipment forward and backward on the inspected object, and wherein the tiling type forward and backward control unit comprises a slide unit being mounted on a coupling plate coupled to the upper surface of the rotation control unit so as to be spaced apart from each other at a predetermined interval, including a first curved surface portion having a structure in which the center portion is depressed downward at the both edges of the upper surface, and a protruding curved rail member having a structure in which the center portion is depressed downward; a plurality of forward and backward guide for guiding sliding to the slide unit, respectively, including a second curved surface portion being seated on the upper surface of the first curved surface portion on both ends of bottom surface and having the same curvature as the first curved surface portion, an accommodation groove for accommodating the curved rail member between the second curved surface portion, and a forward and backward push piece on one end; and an additional forward and backward actuation unit being secured to the slide bar and pressing the forward and backward push piece while extending its length to slide the slide bar.

And, the present invention further comprises a rotating control unit for controlling the additional forward and backward actuation unit to rotate in place at a predetermined angle in the left and right directions when the inspection equipment is viewed from a planar point of view, and wherein the rotating control unit comprises a rotating body secured to a first additional coupling plate coupled to the upper surface of the forward and backward guide and being capable of being rotated in place in left and right directions at a predetermined angle when viewed from a planar point of view; a rotating operation piece coupled to one end of the rotating body and provided to operate the rotating body; a rotating guide housing having a rotating guide groove in which the rotating body is accommodated and rotated, and a rotating long hole for allowing the rotating actuation piece to limitedly move in a horizontal direction being connected to the rotating guide groove on one surface; and a pair of rotating control unit coupled to one surface of the rotating guide housing and facing each other with the rotating operation piece therebetween, and pushing the rotating operation piece alternately with each other to rotate the rotating body at a predetermined angle in forward or backward direction.

Further, the present invention further comprises a horizontal movement control unit for controlling the rotating control unit to horizontally move the inspection equipment in left and right directions on the inspected object, wherein the horizontal movement control unit comprises a horizontal movement means including a horizontal movement member secured to a second additional coupling plate being coupled to the upper surface of the rotating guide housing, and a horizontal movement guide member for guiding the movement of the horizontal movement member and for having the movement push piece on one side, wherein the horizontal movement member and the horizontal movement guide member have at least one or more of a rail groove and a slide bar for guiding movement, respectively; a movement actuation unit coupled to the horizontal movement member and pressing the movement push piece to horizontally move the inspection equipment in right and left directions on the inspected object while varying its length.

And, the horizontal movement control unit further comprises a second holding portion for holding the horizontal movement member, wherein the second holding portion comprises a second coupling member secured to the horizontal movement member and having a contact region contacting the horizontal guide member, and having a spiral hole for holding on the contact region; a second holding member being coupled to the spiral hole of the second coupling member and pressing the horizontal movement guide member to secure the horizontal movement member; and a second guide member coupling to the horizontal movement guide member and having a movement guide long hole for guiding the movement of the second holding member movement.

Further, the forward and backward control unit comprises a forward and backward movement means including the forward and backward movement member coupled to an upper surface of the horizontal movement guide member, and a forward and backward movement guide member guiding the forward and backward movement of the forward and backward movement member while being secured to a fixed object and comprising the forward and backward movement push piece on one side, and wherein at least one of a rail groove and a slide bar for guiding forward and backward movement is formed in the forward and backward movement member and the forward and backward movement guide member, respectively; and a forward and backward actuation unit coupling to the forward and backward movement member and pressing the forward and backward push piece while varying its length to move the inspection equipment forward and backward on the inspected object.

And, the forward and backward control unit further comprises a third holding portion for holding the forward and backward movement member, wherein the third holding portion comprises a third coupling member secured to the forward and backward movement member and having a contact region contacting to the forward and backward movement guide member, and having a spiral hole for holding on the contact region; a third holding member coupling to the spiral hole of the third coupling member and pressing the forward and backward movement guide member to fix the forward and backward movement member; and a third guide member coupling to the forward and backward movement guide member and having a movement guide long hole for guiding the movement of the third holding member.

The adjustment control device for precise measurement according to the present invention can precisely adjust the inspection equipment at various angles such as forward, backward, left, and right directions on the inspection object, and precisely adjusts the distance between the inspection equipment and the inspection object while inspecting the object. There is an effect of precisely measuring the horizontality of an object or precisely performing a vision inspection.

DESCRIPTION OF THE PREFERRED EMBODIMENTS

Advantages and features of the present invention, and methods of achieving them, will become clear with reference to the detailed description of the following embodiments taken in conjunction with the accompanying drawings.

However, the present invention is not limited to the embodiments disclosed below, and may be implemented in various forms, and only these embodiments make the disclosure of the present invention complete, and the present invention is provided to completely inform those skilled in the art of the scope of the invention to which the present invention belongs, and the present invention is only defined by the scope of the claims. Same reference numbers indicate same elements throughout the specification.

Hereinafter, embodiments of the present invention will be described in detail with reference to the accompanying drawings so that those skilled in the art can easily carry out the present invention. However, the present invention may be embodied in many different forms and is not limited to the embodiments described herein. Same reference numbers indicate same elements throughout the specification.

Figure 1:
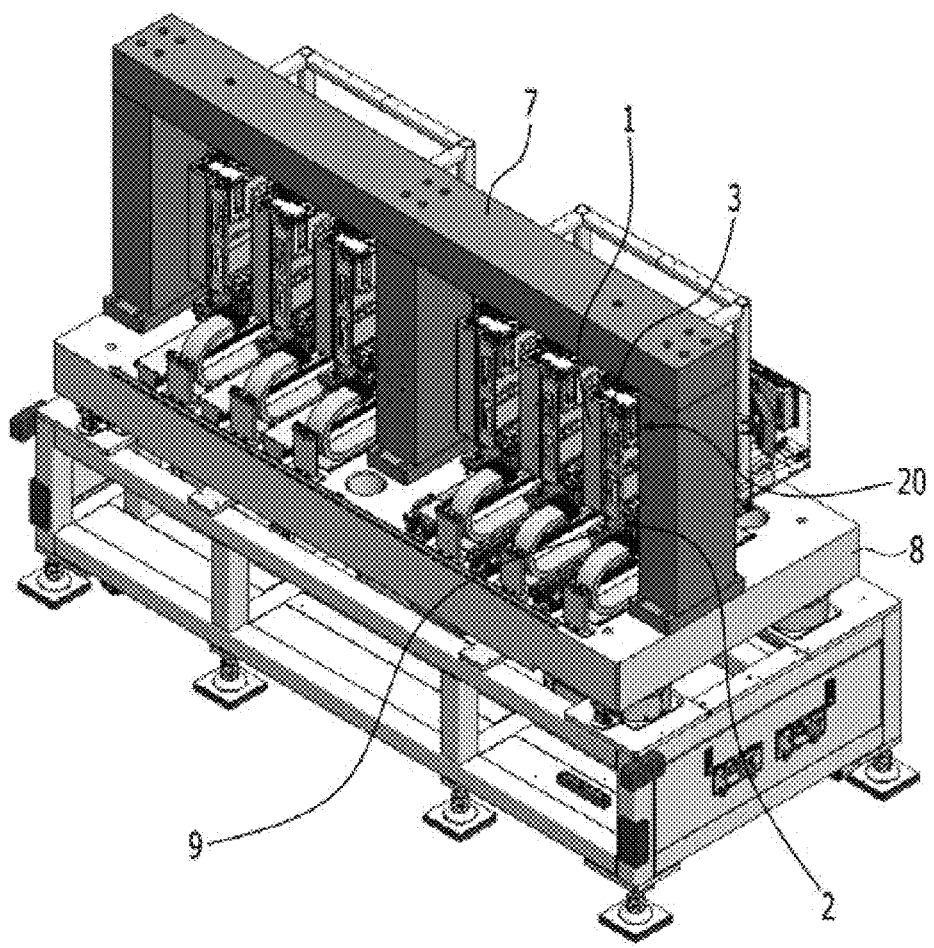
FIG. 1 is a perspective view showing an adjustment control device for precise measurement.
Figure 2:
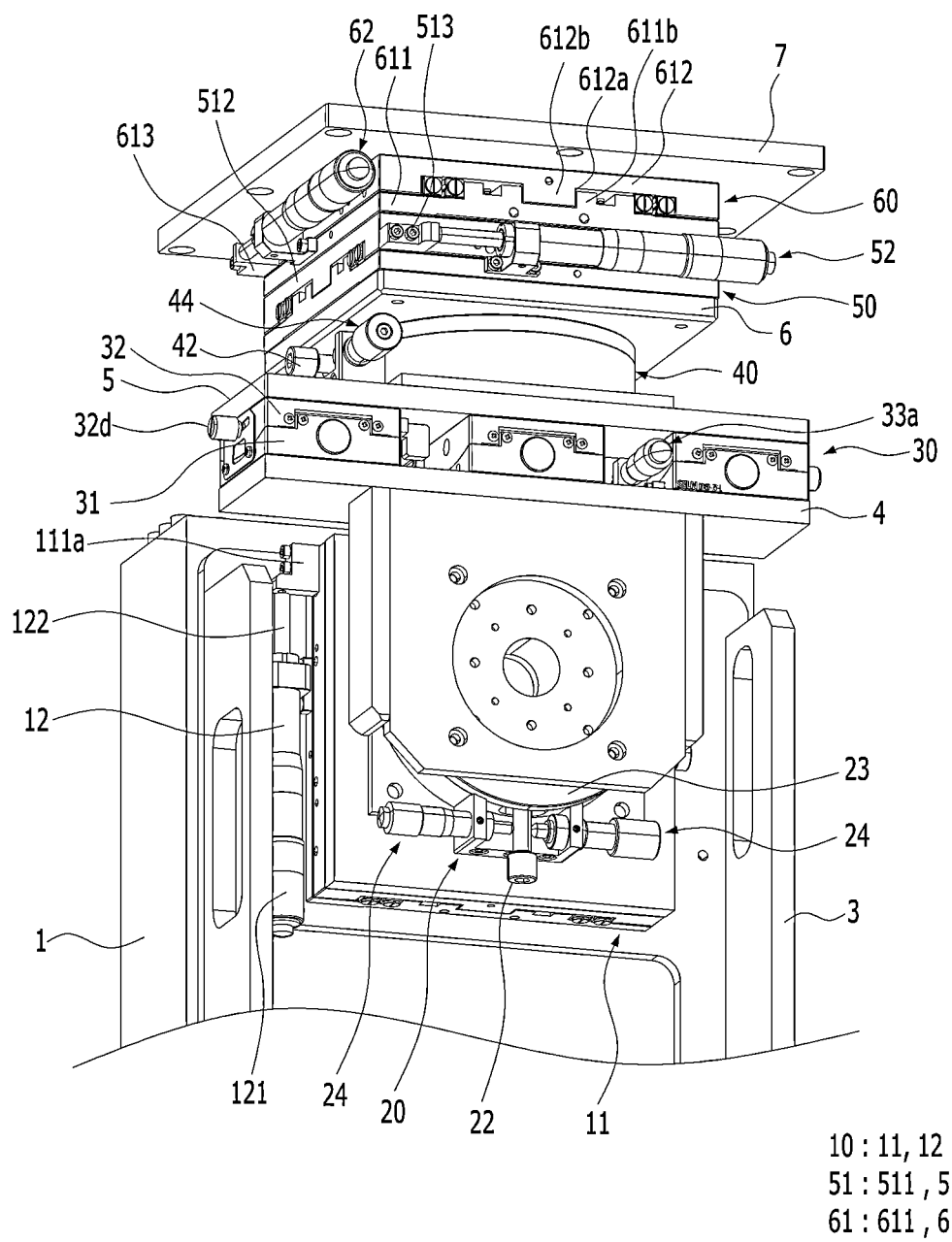
FIGS. 2 and 3 are enlarged perspective views illustrating an adjustment control device for precise measurement according to an embodiment of the present invention.
Figure 3:
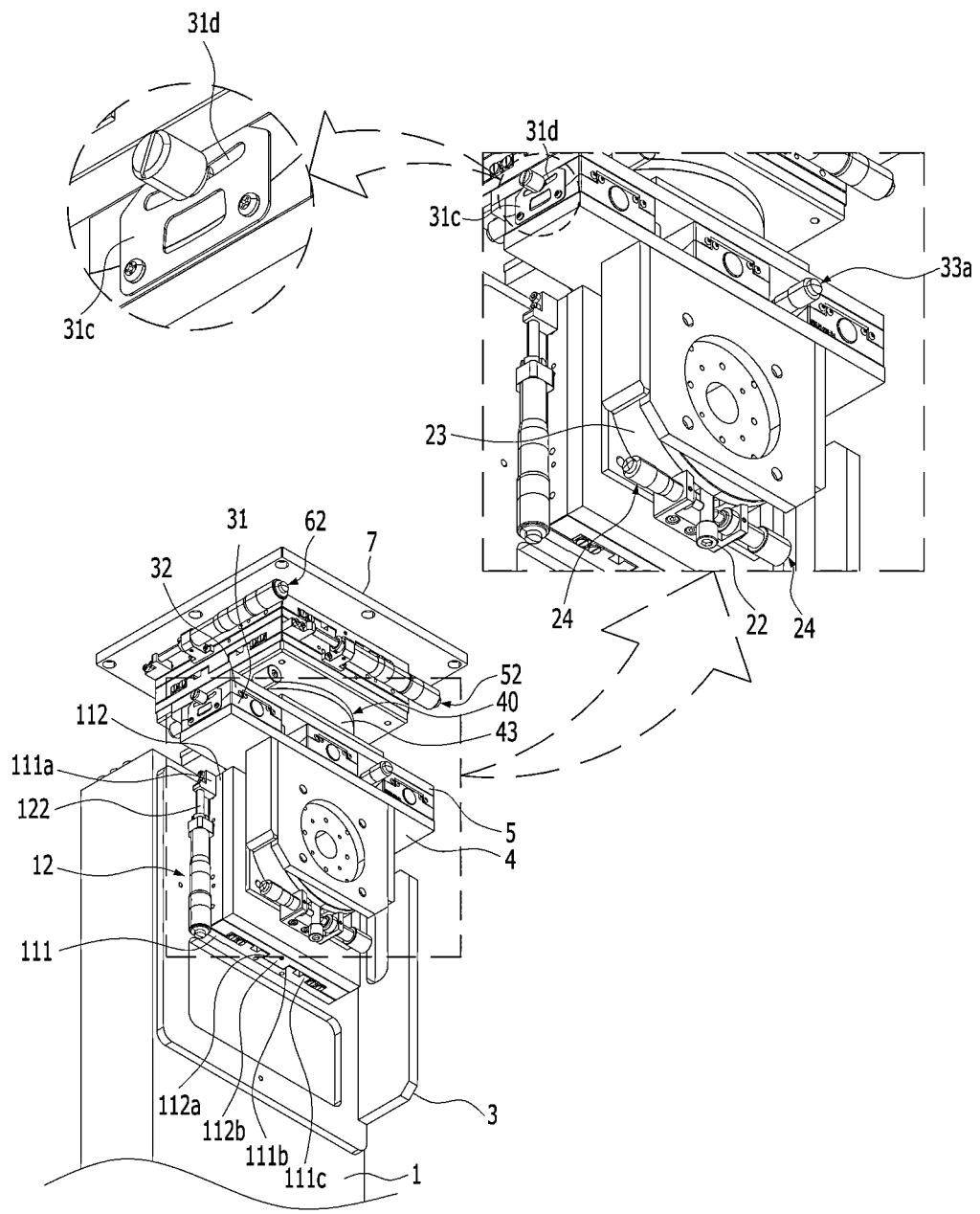
Figure 4:
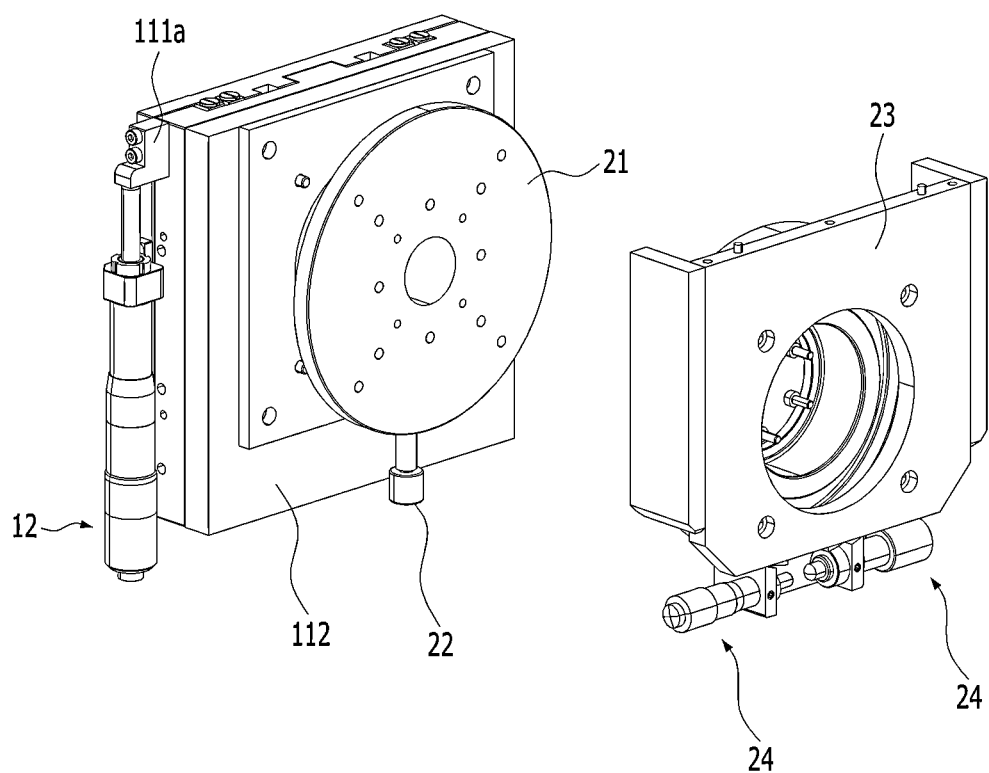
FIG. 4 is a perspective view showing a lowering control unit and a rotation control unit applied to an adjustment control device for precise measurement according to an embodiment of the present invention.
Figure 5:
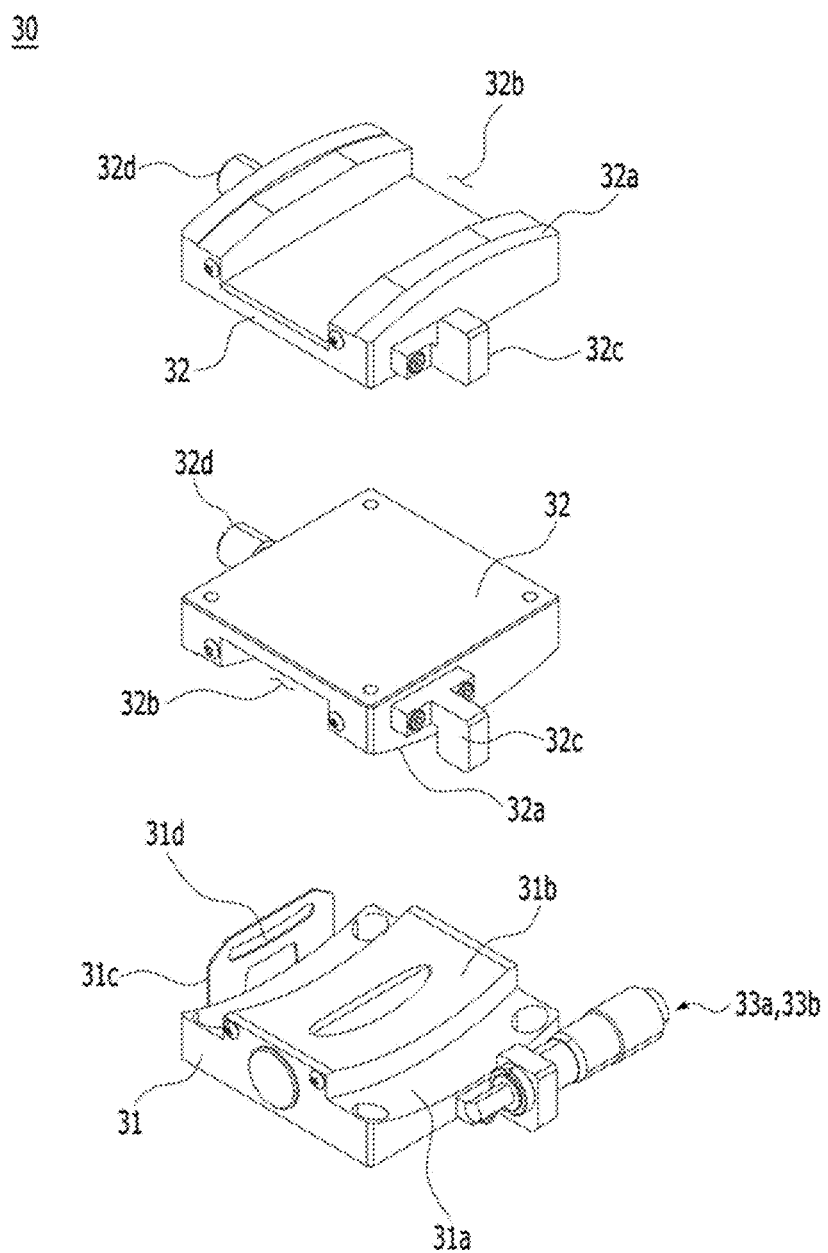
FIG. 5 is an exploded perspective view showing a tilting type forward and backward control unit applied to the adjustment control device for precise measurement according to an embodiment of the present invention.
Figure 6:
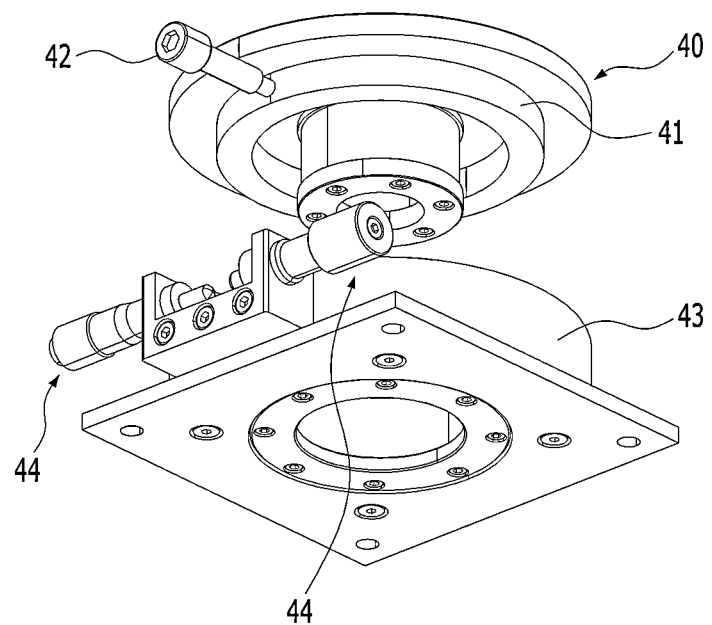
FIG. 6 is a bottom perspective view showing a rotation control unit applied to the adjustment control device for precise measurement according to an embodiment of the present invention.
Figure 7:
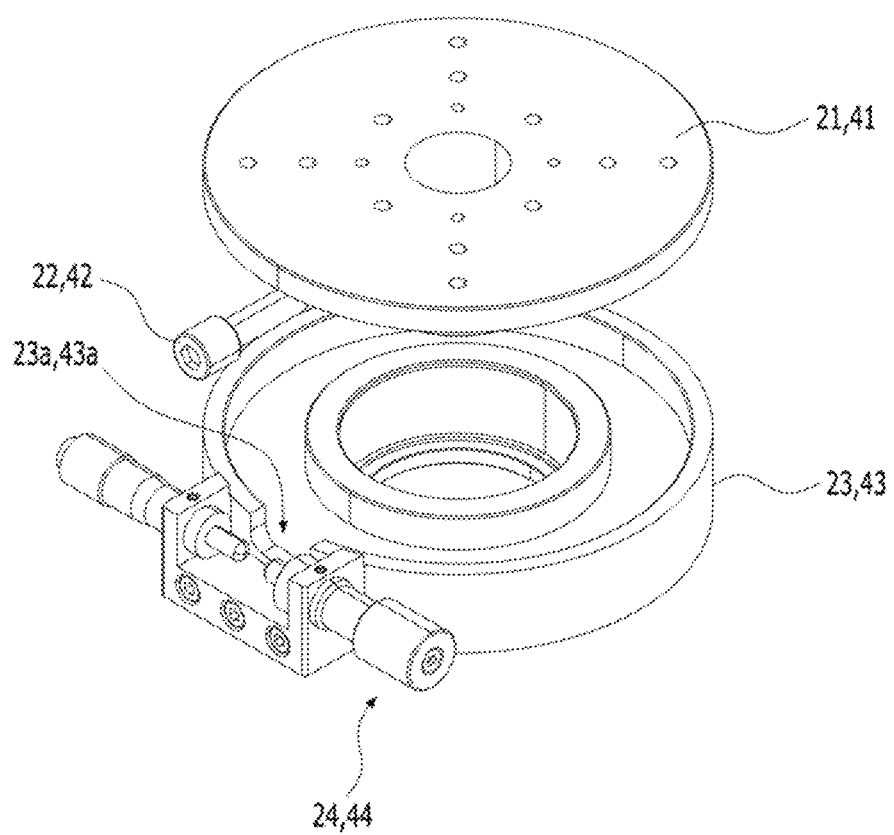
FIG. 7 is a plan perspective view showing a rotation control unit and a rotating control unit applied to an adjustment control device for precision measurement according to an embodiment of the present invention.
Figure 8:
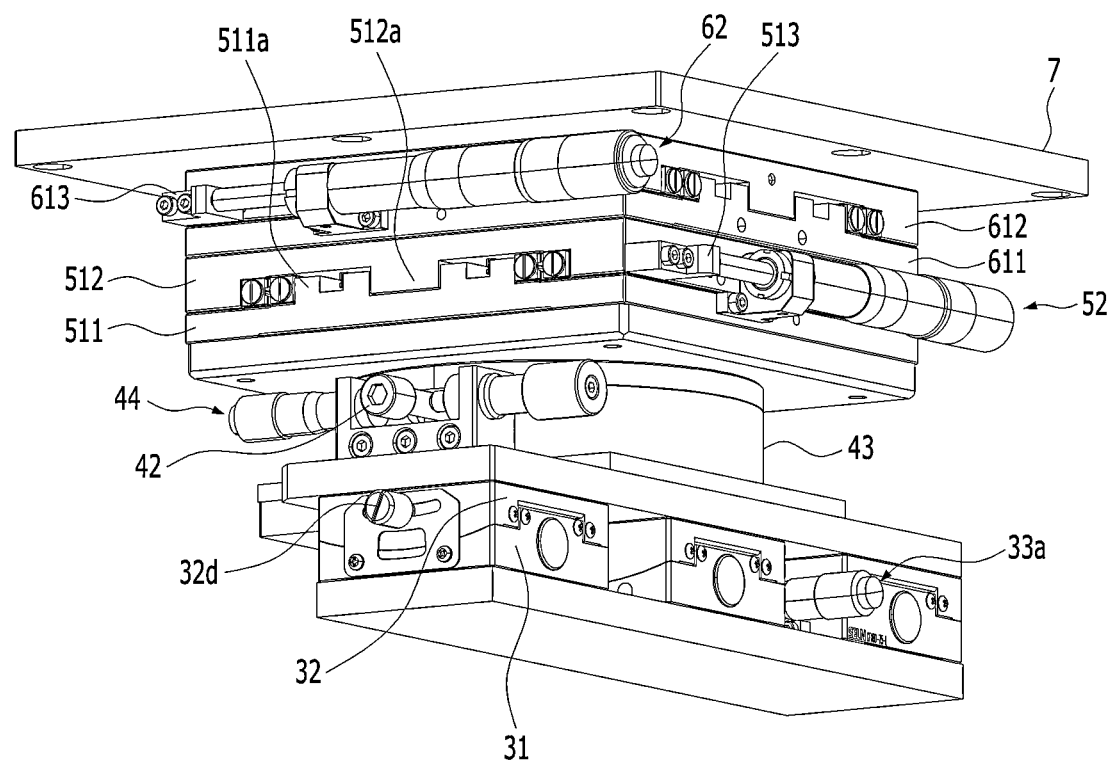
FIGS. 8 and 9 are enlarged perspective views of a tilting type forward and backward control unit, a rotating control unit, a horizontal movement control unit, and a forward and backward control unit applied to an adjustment control device for precise measurement according to an embodiment of the present invention.
Figure 9:
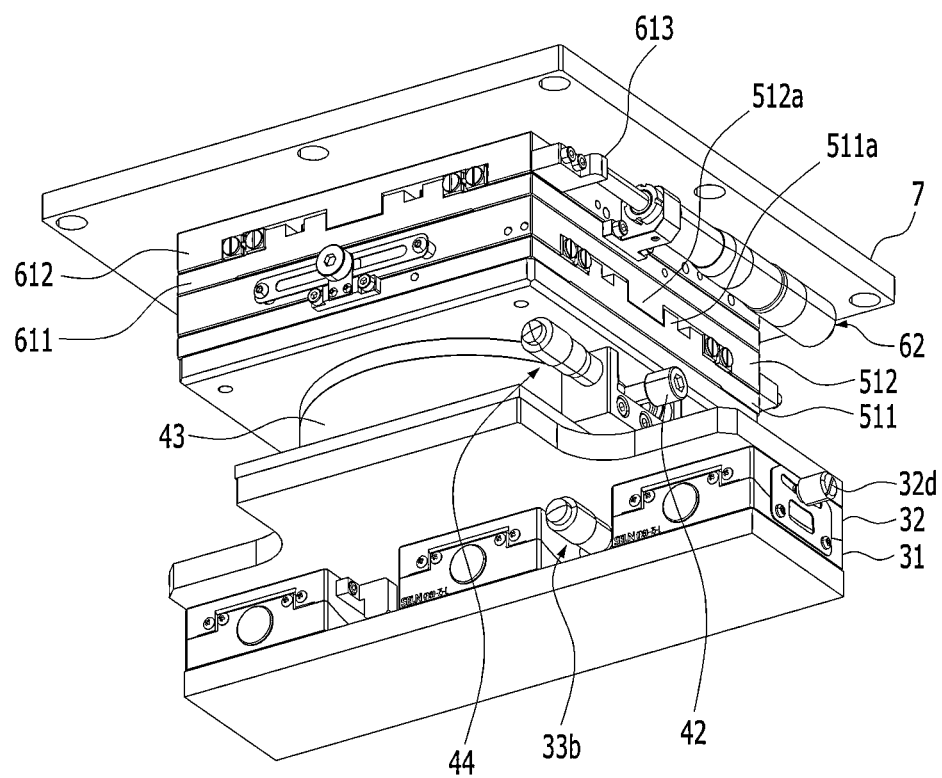
Figure 10:
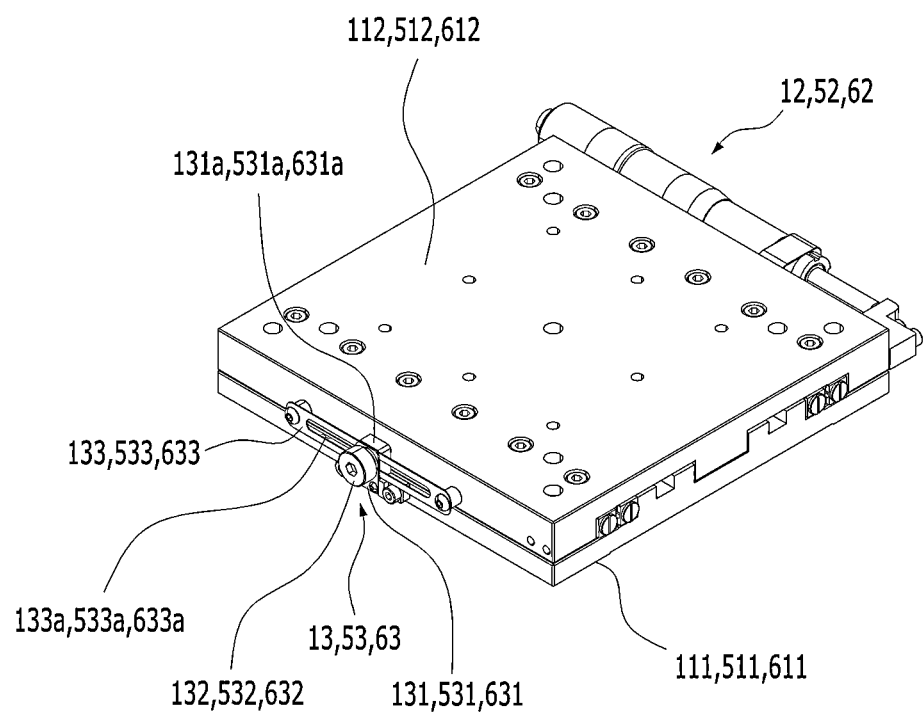
FIG. 10 is a perspective view illustrating a holding unit applied to an adjustment control device for precise measurement according to an embodiment of the present invention.

FIG. 1 is a perspective view showing an adjustment control device for precise measurement, FIGS. 2 and 3 are enlarged perspective views illustrating an adjustment control device for precise measurement according to an embodiment of the present invention, FIG. 4 is a perspective view showing a lowering control unit and a rotation control unit applied to an adjustment control device for precise measurement according to an embodiment of the present invention, FIG. 5 is an exploded perspective view showing a tilting type forward and backward control unit applied to the adjustment control device for precise measurement according to an embodiment of the present invention, FIG. 6 is a bottom perspective view showing a rotation control unit applied to the adjustment control device for precise measurement according to an embodiment of the present invention, FIG. 7 is a plan perspective view showing a rotation control unit and a rotating control unit applied to an adjustment control device for precision measurement according to an embodiment of the present invention, FIGS. 8 and 9 are enlarged perspective views of a tilting type forward and backward control unit, a rotating control unit, a horizontal movement control unit, and a forward and backward control unit applied to an adjustment control device for precise measurement according to an embodiment of the present invention, FIG. 10 is a perspective view illustrating a holding unit applied to an adjustment control device for precise measurement according to an embodiment of the present invention.

An adjustment control device for precise measurement according to an embodiment of the present invention is a product that enables precise measurement by precisely controlling an inspection equipment 1 such as a vision device for inspecting an inspected object 2.

At this time, the inspected object 2 may be a camera module or other various semiconductor chips, but it is revealed that the type of the inspected object 2 is not limited in the adjustment control device for precise measurement according to an embodiment of the present invention.

In addition, the inspection equipment 1 may be a measuring device for measuring the horizontality of the inspected object 2, or a vision device for detecting foreign substances buried in the inspected object 2, but according to an embodiment of the present invention it is revealed that the type of inspection equipment 1 in the adjustment control device for precise measurement is not limited.

when the inspection equipment 1 is a measuring device that measures the horizontality of the inspected object 2, the horizontality of the inspected object 2 is measured by measuring the time for the laser to return after irradiating a laser to the inspected object 2.

An adjustment control device for precise measurement according to an embodiment of the present invention may include at least one or more of a lowering control unit 10, a rotation control unit 20, a tilting type forward and backward control unit 30, a rotating control unit 40, and horizontal movement control unit 50, and a forward and backward control unit 60.

An adjustment control device for precise measurement according to an embodiment of the present invention is applied in multiple numbers so that a plurality of inspected objects 2 can be simultaneously inspected, and is installed on a fixed object 7 formed in a substantially '☐' cross-sectional shape at regular intervals.

Then, the inspected object 2 is seated on the jig 9 disposed on the upper surface of the inspection table 8, and the inspection equipment 1 performs the inspection on the upper side of the inspected object 2.

The lowering control unit 10 is configured to lower the inspection equipment 1 with respect to the inspected object 2.

To this end, the lowering control unit 10 may include an elevation means 11, a lowering actuation unit 12, and a first holding unit 13.

The elevation means 11 includes an elevation member 111 and an elevation guide member 112.

The elevation member 111 is secured to the bracket 3 to which the inspection equipment 1 is secured.

The inspection equipment 1 may be secured to the front of the bracket 3, and the elevation member 111 may be secured to the rear of the bracket 3.

The elevation guide member 112 guides the elevation of the elevation member 111.

To this end, at least one of rail grooves 111*b* and 112*a* and slide bars 111*c* and 112*b* for guiding elevation may be formed in the elevation member 111 and the elevation guide member 112, respectively.

As shown in FIG. 2, a slide bar 111*c* and a rail groove 111*b* are formed on one surface of the elevation member 111 along the longitudinal direction.

In addition, a plurality of slide bars 111*c* are applied and arranged to be spaced apart from each other, and rail grooves 111*b* are formed between the slide bars 111*c*.

In addition, the elevation guide member 112 has a slide bar 112b and a rail groove 112a formed along a longitudinal direction on a surface facing the elevation member 111.

A plurality of slide bars 112b of the elevation guide member 112 are applied and arranged to be spaced apart from each other, and rail grooves 112a are arranged between the slide bars 112b.

The slide bar 111c of the elevation member 111 is inserted into the rail groove 112a of the elevation guide member 112, respectively, and the slide bar 112b of the elevation guide member 112 is inserted into the rail groove 111b of the elevation member 111, respectively.

Accordingly, the elevation member 111 and the slide bar 112b of the elevation guide member 112 are engaged with each other.

In this state, the elevation member 111 may be raised or lowered vertically while being guided by the slide bars 111c and 112b and the rail grooves 111b and 112a.

A lowering push piece 111a having a substantially 'L' cross-sectional shape is formed on one side of the elevation guide member 112.

The lowering control unit 12 is configured to lower the elevation member 111 by pushing the lowering push piece 111a.

The lowering control unit 12 is secured to one side of the elevation member 111.

The lowering control unit 12 pushes the lowering push piece 111a while its length is variable to lower the inspection equipment 1 to the inspected object 2.

The lowering control unit 12 has a hollow cylindrical structure with upper and lower surfaces open and an empty space formed therein so that its length can be varied.

And, a spiral is formed on the inner periphery of the lowering control unit 12.

The lowering control unit 12 may include the rotating handle 121 that moves up and down along the spiral and a push pin 122 coupled to the rotating handle 121.

Although not shown in the drawing, a spiral fastened to the spiral of the lowering control unit 12 is formed in a certain region of the outer periphery of the rotating handle 121.

Accordingly, the rotating handle 121 is moved up and down in a form in which the push pin 122 approaches or moves away from the lowering control unit 12 according to forward or backward rotation.

As a result, the push pin 122 is raised or lowered corresponding to the direction of rotation of the rotating handle 121.

When the push pin 122 is raised, which presses the lowering push piece 111a, and as a result, the lowering operation unit 12 is pushed downward and lowered.

As a result, the elevation member 111, the bracket 3 to which the elevation member 111 is coupled, and the inspection equipment 1 secured to the bracket 3 are uniformly lowered. Therefore, it is possible to bring the inspection equipment 1 closer to the inspected object 2.

In addition, when the inspection equipment 1 is to be spaced apart from the inspected object 2, the operator directly grabs the inspection equipment 1 or the elevation member 111 and lifts it.

The first holding portion 13 holds the elevation member 111 whose height has been adjusted to prevent it from being raised or lowered.

To this end, the first holding portion 13 may include a first coupling member 131, a first holding member 132 and a first guide member 133.

The first coupling member 131 is secured to the elevation member 111 and includes a contact region 131a contacting the elevation guide member 112.

And, the contact region has a spiral hole for holding.

The first holding member 132 may have a bolt structure.

The first holding member 132 is fastened to the spiral hole of the first coupling member 131 and presses the outer surface of the elevation guide member 112 to secure the elevation member 111 whose height has been adjusted.

And, the height of the inspection equipment 1 is changed as necessary, by rotating the first holding member 132 in one direction to separate it from the elevation guide member, and then after changing the height of the elevation member 111 to a desired position through the lowering control unit 12, rotating again the first holding member 132 in the other member to press the elevation guide member 112, and holding the elevation member 111 whose height is adjusted.

The first guide member 133 is coupled to the elevation guide member 112.

The first guide member 133 is secured at a predetermined distance from the elevation guide member 112 through bolts or pieces.

The first guide member 133 has a movement guide long hole 133a for guiding the movement of the first holding member 132.

That is, when the elevation member 111 is elevated, the first holding member 131 is elevated along the movement guide long hole 133a.

The distance between the inspection equipment 1 and the inspected object 2 can be freely and selectively adjusted according to various conditions or conditions such as the characteristics or types of the inspection equipment 1 by the lowering control unit 10.

At this time, the lowering actuation unit 12 is not limited to the above-described configuration, and can be applied to any one selected from various other configurations or various methods in which the push pin 122 can be raised or lowered according to the rotation direction of the rotating handle 121.

At this time, the lowering distance of the inspection equipment 1 can be precisely adjusted according to the rotation angle and number of revolutions of the rotating handle. That is, since the lowering operation of the inspection equipment 1 is proportional to the rising length of the push pin 122, the rotating handle may be gradually rotated to adjust the distance between the inspection equipment 1 and the inspected object 2.

Additionally, although not shown in the drawings, at least one of the elevation member 111 and the elevation guide member 112 may provide a stopper (not shown) which prevents the elevation member 11 from lowering due to its own weight and the weight of the inspection equipment 1.

The stopper may be formed in the form of any one of a spring, a rack, and a wedge, and keeps the elevation member 111 stationary in normal times, but only when the push pin 122 presses the lowering push piece 111a. While allowing the elevation member 111 to lower, when the operator raises the inspection equipment 1 or the elevation member 111, the elevation of the elevation member 111 may be allowed.

These stoppers can be applied with any one of a variety of commercially available products.

On the other hand, the rotation control unit 20 is a configuration that controls the lowering control unit 10 so that the inspection equipment 1 can be rotated at a predetermined angle in the left and right directions when viewed from a frontal point of view. That is, the rotation control unit is configured to move the inspection equipment 1 in a kind of swing motion.

On the other hand, the rotation control unit 20 is a configuration that controls the lowering control unit 10 so that the inspection equipment 1 can be rotated at a predetermined angle in the left and right directions when viewed from a frontal point of view. That is, the rotation control unit is configured to move the inspection equipment 1 in a kind of swing motion.

To this end, the rotation control unit 20 may include a rotation body 21, a rotation operation piece 22, a housing and a rotation actuation unit 24.

The rotation body 21 is coupled to one surface of the elevation guide member 112 constituting the lowering control unit 10.

The rotation body 21 may be coupled to the elevation guide member 112 by pin or bolting coupling.

The rotation body 21 is formed in a substantially circular block shape to rotate clockwise or counterclockwise in the inner space of the rotation guide housing (23).

Due to the rotation body 21, when viewed from the front, the lowering control unit 10 can be rotated in the left and right directions.

The rotation operation piece 22 is coupled to the center portion of the bottom surface of the rotation body 21. The rotation operation piece 22 is provided to rotate the rotation body 21 in left and right directions, and its operation is controlled by a rotation actuation unit 24 to be described later.

The rotation guide housing 23 has a rotation guide groove in which the rotation body 21 is accommodated.

The rotation guide groove is formed in the same circular shape as the rotation body 21.

Therefore, the rotation body 21 can be rotated in the left and right directions while being accommodated and supported in the rotation guide groove.

A rotation long hole 23a through which the rotation operation piece 22 passes is formed on the bottom surface of the rotation guide housing 23, that is, the bottom surface of the rotation guide groove, in a form connected to the rotation guide groove.

That is, a certain area of the rotation operation piece 22 is accommodated in the rotation long hole 23a, and its below area is protruded downward from the rotation guide housing 23.

The rotation operation piece 22 can be moved in the form of drawing a curve in the left and right directions in this state, and one side and the other side thereof are caught on one end wall or the other end wall of the rotation long hole 23a according to the moving distance.

A horizontal rotation distance of the rotation operation piece 22 can be limitedly allowed by the rotation long hole 23a.

The rotation actuation unit 24 is configured to move the rotation operation piece 22 in a leftward or rightward direction based on FIG. 3.

To this end, the rotation actuation units 24 are formed of a pair of two and coupled to the bottom surface of the rotation guide housing 23, and facing each other with the rotation operation piece 22 interposed therebetween.

Since the configuration of the rotation actuation unit 24 is the same as that of the lowering actuation unit 12 described above, a detailed description thereof will be omitted.

By pushing the rotation operation piece 22 by the rotation actuation unit 24, the rotation body 21 can be rotated at a predetermined angle in the left or right direction. Due to this, the left and right angles of the inspection equipment 1 can be adjusted.

This will be described in detail with reference to FIGS. 1 to 4.

For example, in the state shown in FIG. 1, the inspection equipment 1 inspects an approximate central region of the upper surface of the inspected object 2.

In addition, in the case of inspecting the right area of the inspected object 2, the rotating handle of the rotation actuation unit 24 located on the left side is rotated in the forward direction so that the push pin pushes the rotation operation piece 22, and at the same time, the rotating handle of the rotation actuation unit 24 located on the right side may be rotated in the opposite direction so that the push pin is apart from the rotation operation piece 22.

When the rotation operation piece 22 is pushed by the push pin by manipulating the rotating handle located on the left side, the rotation body 21 is rotated by a predetermined angle counterclockwise in the rotation guide groove.

As a result, the elevation guide member 112 coupled to the rotation body 21, the elevation member 111 engaged with the elevation guide member 112 through the slide bar, and the bracket 3 to which the elevation member 111 is coupled, and the inspection equipment 1 secured to the bracket 3 is rotated at a predetermined angle in the right direction.

At this time, when the inspection equipment 1 is rotated by the rotation actuation unit 24, a kind of swing motion is performed with the rotation body 21 as an axis.

Therefore, the inspection equipment 1 is directed to the right area of the upper surface of the inspected object 2, so that the inspection of the right area of the inspected object 2 can be performed.

Conversely, when inspecting the left area of the inspected object 2, the rotating handle of the rotation actuation unit 24 located on the right side is rotated in the forward direction so that the push pin pushes the rotation operation piece 22, at the same time, the rotating handle of the rotation actuation unit 24 located on the left side may be rotated in the opposite direction so that the push pin is away from the rotation operation piece 22.

When the rotation operation piece 22 is pushed by the push pin by manipulating the rotating handle located on the right side, the rotation body 21 is rotated clockwise by a predetermined angle in the rotation guide groove.

As a result, the elevation guide member 112 coupled to the rotation body 21, the elevation member 111 engaged with the elevation guide member 112 through the slide bar, and the bracket 3 to which the elevation member 111 is coupled, and the inspection equipment 1 fixed to the bracket 3 are rotated at a predetermined angle in the left direction.

Therefore, the inspection equipment 1 is directed to the right area of the upper surface of the inspected object 2, so that the inspection of the left area of the inspected object 2 can be performed.

At this time, the rotation angle of the inspection equipment 1 may be adjusted according to the rotation direction, rotation angle, and number of rotations of the rotating handle. That is, since the rotation of the inspection equipment 1 is proportional to the moving distance of the rotation operation piece 22 pushed to the push pin, When the left side of the rotation operation piece 22 is pushed by gradually rotating the rotating handle located on the left side, the inspection equipment 1 is gradually rotated in the right direction, and when the rotating handle located on the right is gradually rotated to push the right side of the rotation operation piece 22, the inspection equipment 1 is gradually rotated in the left direction. As a result, the inspection equipment 1 can inspect all areas from the left end to the right end of the object to be inspected object 2 by adjusting the rotation direction, rotation angle, and number of rotations of the rotating handle.

On the other hand, the tilting type forward and backward control unit 30 is disposed above the rotation control unit 20, and is configured to control the rotation control unit 20 so that the inspection equipment 1 moves forward and backward while being tilted in forward or backward directions on the inspected object 2.

To this end, the tilting type forward and backward control unit 30 may include a slide unit 31, a forward and backward guide 32, and an additional forward and backward actuation unit 62.

A plurality of slide units 31 are applied and mounted on the coupling plate 4 coupled to the upper surface of the rotation control unit 20 to be spaced apart from each other at a predetermined interval.

The slide units 31 operate integrally with each other due to being coupled to the coupling plate 4.

At both edges of the upper surface of the slide unit 31, a first curved surface portion 31a having a structure in which the center area is depressed downward, and the front and rear sides of the center area are inclined upward, respectively, is formed.

Further, in the center of the upper surface of the slide unit 31, a curved rail portion 31b having a structure in which the center part is depressed downward and the front and rear sides of the center area are inclined upward, respectively, is protruded.

At this time, the above-described first curved surface portion 31a is formed on both sides of the curved rail portion.

A separation prevention bracket 31c is formed on one side of the slide unit 31 to prevent separation from the forward and backward guides 32.

A certain area of the separation prevention bracket 31c protrudes upward to the first curved surface portion 31a.

A curved horizontal long hole 31d that substantially prevents the forward and backward guides 32 from separating is formed in the protruding area of the separation prevention bracket 31c.

The forward and backward guides 32 guide the sliding to the slide unit 31, respectively, and are seated on the upper surface of the first curved surface portion 31a on both sides of the bottom surface and the second curved surface portion 32a having the same curvature as the first curved surface portion 31a protrudes downward.

In addition, the forward and backward guide 32 has an accommodating groove 32b in which the curved rail member 31b is accommodated between the second curved surface portion 32a.

In addition, a forward and backward push piece 32c is formed on one side of the forward and backward guide 32 to be pushed by the additional forward and backward actuation unit 62.

And, on the other side of the forward and backward guide 32, a separation prevention pin 32d is formed to move along the curved horizontal long hole 31d.

The additional forward and backward actuation unit 62 moves the slide unit 31 forward or backward, and when it moves forward or backward, returns it to its original position.

The drawing shows an example in which three slide unit 31 and forward and backward guides 32 are applied, respectively, and the slide unit 31 are installed on one coupling plate 4 and can be driven integrally. As shown, even if only two of the additional forward and backward operation units 62 are applied, the three slide units 31 can be uniformly moved forward or backward.

The additional forward and backward actuation unit 62 is fixed to one side of any two slide units 31 among the three slide units 31, respectively, as shown in FIGS. 8 and 9, respectively.

At this time, the first additional forward and backward actuation unit 33a is coupled to move the slide unit 31 forward, and the second additional forward and backward actuation unit 33b is coupled to relatively move the slide unit 31 backward.

Since the configuration of the additional forward and backward actuation unit 62 is the same as that of the lowering actuation unit 12 and the rotation operation unit 24, a detailed description thereof will be omitted.

By pushing each of the forward and backward push pieces 32c through the additional forward and backward actuation units 33a and 33b, the inspection equipment 1 can be moved forward or backward from the top of the inspected object 2.

Next, an operation example of the tilting type forward and backward control unit 30 described above will be described.

For example, in the state shown in FIG. 1, the inspection equipment 1 inspects an approximate central region of the upper surface of the inspected object.

In addition, when inspecting the front region of the inspected object 2, the rotating handle of the first additional forward and backward actuation unit 33a is rotated in the forward direction so that the push pin pushes the forward and backward push piece 32c, at the same time, the rotating handle of the second additional forward and backward actuation unit 33b is rotated in the opposite direction so that the push pin is apart from the other forward and backward push pieces 32c.

Due to this, the slide unit 31 slides in the forward direction in the forward and backward guide 32, and in this process, the first curved surface portion 31a moves along the second curved surface portion 32a, as a result, the inspection equipment 1 moves forward while being tilted at a predetermined angle.

At this time, the inspection equipment 1 inspects a certain area on the front side of the inspected object 2 in a state where the lower side is tilted toward the front of the central region of the inspected object 2 and the upper side is tilted toward the rear of the central region of the inspected object 2.

Contrary to this, when inspecting the rear area of the inspected object 2, the rotating handle of the first additional forward and backward actuation unit 33a is rotated in the backward direction so that the push pin moves away from the forward and backward push piece 32c. At the same time, the rotating handle of the second additional forward and backward actuation unit 33b is rotated in the forward direction so that the push pin pushes the other forward and backward push piece 32c.

Due to this, the slide unit 31 slides in the backward direction in the forward and backward guide 32, and in this process, the first curved surface portion 31a rides on the second curved surface portion 32a as a result, the inspection equipment 1 moves backward while being tilted.

At this time, the inspection equipment 1 inspects a certain area on the rear side of the inspected object 2 in a state where the lower side is tilted toward the rear of the central region of the inspected object 2 and the upper side is tilted toward the front of the central region of the inspected object 2.

At this time, forward and backward distances and tilting angles of the inspection equipment 1 may be adjusted according to the rotation direction, rotation angle, and number of rotations of the rotating handle. That is, the forward, backward and tilting of the inspection equipment 1 is proportional to the moving distance of the forward and backward push piece 32*c* pushed on the push pin, so that the rotating handle of the first additional forward and backward actuation unit 33*a* is gradually rotated to push the forward and backward push piece 32*c* so that the inspection equipment 1 is gradually moved forward and tilted. When the rotating handle of the second additional forward and backward actuation unit 33*b* is gradually rotated to push the forward and backward push piece 32*c* in the opposite direction so that the inspection equipment 1 gradually moves backward and is tilted. As a result, the inspection equipment 1 can inspect all areas from the front end to the rear end of the inspected object while maintaining a certain inclination angle by adjusting the rotation direction, rotation angle, and number of rotations of the rotating handle.

On the other hand, the rotating control unit 40 is configured to control the additional forward and backward drive unit so that the inspection equipment 1 can be selectively rotated in place at a predetermined angle in a clockwise or counterclockwise direction when viewed from a planar perspective.

To this end, the rotating control unit 40 may include a rotating body 41, a rotating operation piece 42, a rotating guide housing 43, and a rotating actuation unit 44.

The rotating body 41 is coupled to the upper surface of the first additional coupling plate 5 coupled to the upper surface of the forward and backward guides 32.

The rotating body 41 may be coupled to the first additional coupling plate 5 by pin or bolting coupling.

The rotating body 41 may be formed in a substantially circular block shape and rotate clockwise or counterclockwise in the inner space of the rotating guide housing 43.

When viewed from the frontal point of view, it is possible to rotate the additional forward and backward driving unit in the left and right directions due to the rotating body 41.

When the additional forward and backward driving unit is rotated in the left and right directions, the rotation control unit 20, the lowering control unit 10, the bracket, and the inspection equipment 1 are rotated in the left and right directions at the same time.

The rotating operation piece 42 is coupled to one end of the rotating body 41. The rotating operation piece 42 is provided to rotate the rotating body 41 in left and right directions, and its operation is controlled by a rotation actuation unit 44 to be described later.

The rotating guide housing 43 has a rotating guide groove in which the rotating body 41 is accommodated.

The rotating guide groove is formed in the same circular shape as the rotating body 41.

Therefore, the rotating body 41 can be rotated in the left and right directions while being accommodated in the rotating guide groove.

On one side of the rotating guide housing 43, a rotating long hole 43*a* through which the rotating operation piece 42 passes is formed in a form connected to the rotating guide groove.

That is, a certain area of the rotating operation piece 42 is accommodated in the rotating long hole 43*a*, and a certain area protrudes out of the rotating guide housing.

In this state, the rotating operation piece 42 can be moved in the form of drawing a curve in the left and right directions, and one side and the other side thereof are caught on one end wall or the other end wall of the rotating long hole 43*a* according to the moving distance.

A horizontal rotational distance of the rotating operation piece 42 may be limitedly allowed through the rotating long hole 43*a*.

The rotating actuation unit 44 is configured to move the rotating operation piece 42 in a leftward or rightward direction based on FIG. 6.

To this end, the rotating actuation units 44 are composed of a pair of two, so that they are coupled to one surface of the rotation guide housing 43, and face each other with the rotating operation piece 42 interposed therebetween.

Since the configuration of the rotating actuation unit 44 is the same as that of the aforementioned rotation actuation unit 24, a detailed description thereof will be omitted.

By pushing the rotating operation piece 42 through the rotating actuation unit 44, the rotating body 41 can be rotated at a predetermined angle in the left or right direction. Due to this, the angle can be adjusted by adjusting the inspection equipment 1 clockwise or counterclockwise.

This will be described in detail with reference to FIGS. 1, 6 and 7.

For example, in the state shown in FIG. 1, the inspection equipment 1 inspects an approximate central region of the upper surface of the inspected object 2.

In such a state, a situation in which the inspection unit must be rotated in place at a predetermined angle may occur due to the type, size, shape, and other various reasons of the inspected object 2.

That is, the rotating control unit 40 can be used only in the above-mentioned special situation.

When it is desired to rotate the inspection equipment 1 in the right direction by a predetermined angle, the rotating handle of the rotating actuation unit 44 located on the left side is rotated in the forward direction so that the push pin pushes the rotating operation piece 42, at the same time, the rotating handle of the rotating actuation unit 44 located on the right side may be rotated in the backward direction so that the push pin is apart from the rotating operation piece 42.

When the rotating operation piece 42 is pushed by the push pin by manipulating the rotating handle located on the left side, the rotating body 41 is rotated by a predetermined angle counterclockwise in the rotating guide groove.

As a result, the first additional coupling plate 5 coupled to the rotating body 41, the tilting type forward and backward driving unit, the rotation control unit 20, the lowering control unit 10, the bracket 3 and the inspection equipment 1 are rotated counterclockwise by a predetermined angle.

On the contrary, when it is desired to rotate the inspection equipment 1 in the left direction by a predetermined angle, the rotating handle of the rotating actuation unit 44 located on the right side is rotated in the forward direction so that the push pin pushes the rotating operation piece 22, at the same time, by rotating the rotating handle of the rotating actuation unit 44 located on the left side in the backward direction, the push pin may move away from the rotating operation piece 42.

When the rotating operation piece 42 is pushed by the push pin by manipulating the rotating handle located on the right side, the rotating body 41 is rotated clockwise by a predetermined angle in the rotating guide groove.

As a result, the first additional coupling plate 5 coupled to the rotating body 41, the tilting type forward and backward drive unit, the rotation control unit 20, the lowering control unit 10, the bracket 3 and the inspection equipment 1 are rotated clockwise by a predetermined angle.

Through the rotating control unit 40, the inspected object 2 can be inspected in various ways while selectively and freely rotating the inspection equipment 1 in a clockwise or counterclockwise direction as needed.

Meanwhile, the horizontal movement control unit 50 controls the rotating control unit 40 to horizontally move the inspection equipment 1 disposed above the inspected object 2 in left and right directions.

To this end, the horizontal movement control unit 50 may include a horizontal movement means 51, a movement actuation unit 52, and a second holding portion 53.

The horizontal movement means 51 may include a horizontal movement member 511 secured to the upper surface of the second additional coupling plate 6 secured to the upper surface of the rotating guide housing 43 and a horizontal movement guide member 512 for guiding the movement of the horizontal movement member 511 and having a movement push piece 513 on one side.

In addition, at least one of rail grooves 511b and 512b and slide bars 511a and 512a for guiding movement may be formed in the horizontal movement member 511 and the horizontal movement guide member 512, respectively.

As shown in FIGS. 8 and 9, a slide bar 511a and a rail groove 511b are formed on the upper surface of the horizontal movement member 511 along the longitudinal direction.

In addition, a plurality of slide bars 511a are applied and arranged to be spaced apart from each other, and rail grooves 511b are formed between the slide bars 511a.

In addition, a slide bar 512a and a rail groove 512b are formed on the bottom surface of the horizontal movement guide member 512 along the longitudinal direction.

A plurality of slide bars 512a of the horizontal movement guide member 512 are applied and arranged to be spaced apart from each other, and rail grooves 512b are arranged between the slide bars 512a.

The slide bar 512a of the horizontal movement guide member 512 is inserted into the rail groove 511b of the horizontal movement member 511, respectively, and the slide bar 511a of the horizontal movement member 511 is inserted into the rail grooves 512b of the horizontal movement guide member 512, respectively.

Accordingly, the horizontal movement member 511 and the horizontal movement guide member 512 are engaged with each other.

In this state, the horizontal moving member 511 is guided to the slide bars 511a and 512a and the rail grooves 511b and 512b and can be moved in both directions in the horizontal direction.

The movement actuation unit 52 is configured to move the horizontal movement member 511 in both directions in the horizontal direction.

The movement actuation unit 52 is fixed to one side of the horizontal movement member 511.

Since the configuration of the movement actuation unit 52 is the same as that of the aforementioned control units, a detailed description thereof will be omitted.

Through such a movement actuation unit 52, the inspection equipment 1 can be moved in the horizontal direction, that is, along the left and right width directions of the inspected object 2.

This will be described in detail with reference to FIGS. 1, 8 and 9.

For example, in the state shown in FIG. 1, the inspection equipment 1 inspects an approximate central region of the upper surface of the inspected object 2.

And, when inspecting the right area of the inspected object 2, the rotating handle is rotated in one direction. When the rotating handle is rotated, the push pin moves forward and the movement push piece 513 is pushed.

In this way, when the push pin pushes the movement push piece 513, the horizontal movement member 511 slides to the right, and eventually the inspection equipment 1 moves to the right.

Therefore, the right side of the inspected object 2 can be inspected by the inspection equipment 1.

At this time, the horizontal movement distance of the inspection equipment 1 may be adjusted according to the rotation angle and the number of rotations of the rotating handle constituting the horizontal movement actuation unit 50. That is, since the rightward movement of the inspection equipment 1 is proportional to the forward length of the push pin pushing the movement push piece 513, when the movement push piece 513 is pushed by gradually rotating the rotating handle, the inspection equipment 1 is gradually moved to the right. As a result, the inspection equipment 1 can inspect all areas from the center to the right end of the inspected object 2 by adjusting the rotation angle and the number of rotations of the rotating handle.

And, in the case of inspecting the left area of the inspected object 2, the operator can directly push the inspection equipment 1 to the left side to inspect it.

The second holding portion 53 is configured to hold the horizontal movement member 511 for which horizontal positioning has been completed so as not to move.

To this end, the second holding portion 53 may include a second fastening member 531, a second holding member 532, and a second guide member 533.

The second fastening member 531 is secured to the horizontal movement member 511 and includes a contact region 531a contacting the horizontal movement guide member.

Also, a spiral hole for holding is formed in the contact region 531a.

The second holding member 532 may have a bolt structure.

The second holding member 532 presses the outer surface of the horizontal movement guide member while being fastened to the spiral hole of the second fastening member 531 to fix the horizontal movement member 511 whose location has been moved in the horizontal direction.

And, when changing the left and right positions of the inspection equipment 1 as needed, rotate the second holding member 532 in one direction to separate it from the horizontal guide member 512, and then after changing the position of the horizontally movement member 511 to a desired position through the movement actuation unit 52, by rotating again the second holding member 532 in the other direction to press the horizontal movement guide member 512, the horizontally movement member 511 whose position is changed is held.

The second guide member 533 is coupled on the horizontal movement guide member 512.

The second guide member 533 is secured at a predetermined distance from the horizontal movement guide member 512 through bolts or pieces.

A movement guide long hole 533a for guiding the movement of the second holding member 532 is formed in the second guide member 533.

That is, when the horizontal movement member 511 is moved, the second holding member 532 is moved along the movement guide long hole 533a.

Although not shown in the drawings, the second holding portion may be omitted. In this case, an example in which the movement actuation unit 52 is coupled to the right side of the horizontal movement member 511 is shown in FIG. 8, and if another movement control unit (not shown) having a structure capable of moving the horizontal movement member 511 in the left direction and a moving push piece 513 are added to the left side of the horizontal movement member 511, the inspection equipment 1 will be able to be easily moved along the left and right width directions of the inspected object 2.

However, if the movement actuation unit 52 and the movement push piece 513 are provided on the front and rear surfaces of the horizontal movement member 511, respectively, another movement actuation unit 52 may come into contact with the movement push piece 513 to limit its movement distance in the process of moving the inspection equipment 1 to the left or right.

To prevent this, it is preferable to detachably couple the movement control unit 52 and the movement push piece 513 through bolts or the like.

On the other hand, the forward and backward control unit 60 is configured to transmit a moving force to the rotation control unit 20 so that the inspection equipment 1 can be moved forward or backward on the inspected object 2.

To this end, the forward and backward control unit 60 may include a forward and backward movement means 61, a forward and backward actuation unit 62, and a third holding portion 63.

The forward and backward movement means 61 may include a forward and backward movement member 611 coupled to the upper surface of the horizontal movement guide member 512, and a forward and backward movement guide member 612 which guides a forward and backward movement of the forward and backward movement member 611 in a state that it is secured to the fixed object 7 and has a forward and backward push piece 613 on one side.

In addition, at least one or more of rail grooves 611*a* and 612*a* and slide bars 611*b* and 612*b* for guiding movement are formed in the forward and backward movement member 611 and the forward and backward movement guide member 612, respectively.

As shown in FIGS. 8 and 9, a slide bar 611*b* and a rail groove 611*a* are formed on the upper surface of the forward and backward movement member 611 along the longitudinal direction.

In addition, a plurality of slide bars 61*b* are applied and arranged to be spaced apart from each other, and rail grooves 611*a* are formed between the slide bars 611*b*.

In addition, a slide bar 612*b* and a rail groove 612*a* are formed on the bottom surface of the forward and backward movement guide member 612 along the longitudinal direction.

A plurality of slide bars 612*b* of the forward and backward movement guide member 612 are applied and arranged to be spaced apart from each other, and rail grooves 612*a* are arranged between the slide bars 612*b*.

The slide bar 612*b* of the forward and backward movement guide member 612 is inserted into the rail groove 611*a* of the forward and backward movement member 611, respectively, and the slide bar 61*b* of the forward and backward movement member 611 is inserted into the rail grooves 612*a* of the forward and backward movement guide members 612, respectively.

Thus, the horizontal movement member 511 and the horizontal movement guide member 512 are engaged with each other.

In this state, the forward and backward movement member 611 can be moved forward and backward while being guided to the slide bars 611*b* and 612*b* and the rail grooves 611*a* and 612*a*.

The forward and backward actuation unit 62 moves the forward and backward movement member 611 forward or backward.

The forward and backward actuation unit 62 is secured to one side of the forward and backward movement member 611.

Since the configuration of the forward and backward actuation unit 62 is the same as that of the aforementioned operation units, a detailed description thereof will be omitted.

The inspection equipment 1 can be moved in the forward and backward directions of the inspected object 2 by the forward and backward actuation unit 62.

This will be described in detail with reference to FIGS. 1, 8 and 9.

For example, in the state shown in FIG. 1, the inspection equipment 1 inspects an approximate central region of the upper surface of the inspected object 2.

And, when it is desired to inspect the rear area of the inspected object 2, the rotating handle is rotated in one direction. When the rotating handle is rotated, the push pin moves forward and pushes the forward and backward push pieces 613.

In this way, when the push pin pushes the forward and backward push piece 613, the forward and backward movement member 611 slides rearward, and eventually the inspection equipment 1 moves backward.

Therefore, it is possible to inspect from the central part to the rear part of the inspected object 2 with the inspection equipment 1.

At this time, the backward movement distance of the inspection equipment 1 may be adjusted according to the rotation angle and the number of rotations of the rotating handle constituting the forward and backward actuation unit 60. That is, since the movement of the inspection equipment 1 in the backward direction is proportional to the forward length of the push pin that pushes the forward and backward push pieces 613, when the rotating handle is gradually rotated to push the forward and backward push pieces 613, the inspection equipment 1 is gradually reversed. As a result, the inspection equipment 1 can inspect all areas from the center to the rear end of the inspected object 2 by adjusting the rotation angle and the number of rotations of the rotating handle.

And, in the case of inspecting the front area of the inspected object 2, the operator can directly push the inspection equipment 1 forward and inspect it.

The third holding portion 63 is configured to hold the forward and backward movement member so as not to move after completing position control in the forward and backward direction.

To this end, the third holding portion 63 may include a third coupling member 631, a third holding member 632 and a third guide member 633.

The third coupling member 631 is fixed to the forward and backward movement member 611 and includes a contact region 633*a* contacting the forward and backward movement guide member.

And, a spiral hole for holding is formed in the contact region 633*a*.

The third holding member 632 may have a bolt structure.

The third holding member 632 presses the outer surface of the forward and backward movement guide member 612 while being fastened to the spiral hole of the third coupling member 631 so that the forward or backward movement member 611 whose position movement is completed is secured.

And, in a case of changing the forward and backward position of the inspection equipment 1 as needed, the third holding member 632 is rotated in one direction to is separated it from the forward and backward movement guide member 612, and then after changing the position of the forward and backward movement member 611 by the forward and backward actuation unit 62 to a desired position, the third holding member 632 is rotated again in the other direction to press the forward and backward movement guide member 612, thereby, the forward and backward movement member 611 whose position has been changed is held.

The third guide member 633 is coupled to the forward and backward movement guide member 612.

The third guide member 633 is secured at a predetermined distance from the forward and backward movement guide member 612 through bolts or pieces.

A movement guide long hole 633a for guiding movement of the third holding member 632 is formed in the third guide member 633.

That is, when the forward and backward movement member 611 moves, the third holding member 632 moves along the movement guide long hole 633a.

Although not shown in the drawings, the third holding portion may be omitted. And, since an example in which the forward and backward actuation unit 62 is coupled to the front of the forward and backward movement member 611 is depicted in the drawing, if another forward and backward actuation unit having a structure that can move the forward and backward movement member 611 forward (not shown) and the forward and backward push piece (not shown) are added to the rear surface of the forward and backward movement member 611, the inspection equipment 1 can be easily moved in the front and rear directions of the inspected object 2.

However, if the forward and backward actuation unit 62 and the forward and backward push pieces are provided on the left and right sides of the forward and backward movement guide member 612, respectively, another forward and backward actuation unit 62 may come into contact with the forward and backward push piece in the process that the inspection equipment 1 moves forward or backward by any one forward and backward actuation unit 62, so that the moving distance may be limited.

In order to prevent this, it is preferable to detachably couple the forward and backward actuation unit 62 and the forward and backward push piece through bolts or the like.

An adjustment control device for precise measurement according to an embodiment of the present invention can measure the horizontality of a various part of the inspected object 2 and perform a vision test while moving the inspection equipment 1 on the inspected object to a various position or adjusting the space of the inspection equipment 1 with respect to the inspected object 2 by the above-described lowering control unit 10, rotation control unit 20, tilting type forward and backward control unit 30, rotating control unit 40, the horizontal movement control unit 50, and the forward and backward control unit 60.

In addition, in the adjustment control device for precise measurement according to an embodiment of the present invention, it is revealed that all components of the lowering control unit 10, the rotation control unit 20, the tilting type forward and backward control unit 30, the rotating control unit 40, and the horizontal movement control unit 50 and the forward and backward control unit 60 or like are not essentially used when measuring the horizontality of the inspected object 2 or inspecting the vision.

That is, the operator can selectively control at least one configuration to measure the horizontality or inspect the vision for various reasons such as the shape characteristics of the inspected object 2 or measurement conditions.

Those skilled in the art to which the present invention pertains will understand that the present invention can be embodied in other specific forms without changing its technical spirit or essential features. Therefore, the embodiments described above should be understood as illustrative in all respects and not limiting. The scope of the present invention is indicated by the claims to be described later rather than the detailed description above, and it should be interpreted that all changes or modifications derived from the meaning and scope of the claims and equivalent concepts thereof are included in the scope of the present invention.

What is claimed is:

1. An adjustment control device for precise measurement that controls an inspection equipment for inspecting an inspected object to perform precise measurement, the device comprising:
    a lowering control unit lowering the inspection equipment with respect to the inspected object;
    a rotation control unit being coupled to the lowering control unit and controlling the lowering control unit to rotate the inspection equipment at a predetermined angle in left and right directions when viewed from a frontal point of view;
    a forward and backward control unit being disposed above the rotation control unit and transmitting a moving force to the rotation control unit to move the inspection equipment forward or forward on the inspected object; and
    wherein the rotation control unit comprises:
        a rotation body secured to one surface of the lowering control unit, and being capable of being rotated in the left and right directions together with the lowering control unit, when viewed from the frontal point of view;
        a rotation operation piece coupled to one end of the rotation body, and being provided for operating the rotation motion of the rotation body:
        a rotation guide housing including a rotation guide groove in which the rotation body is accommodated and rotated, and a rotation long hole for allowing a limited horizontal movement distance of the rotation operation piece to be coupled the rotation guide groove on the bottom surface; and
        a pair of rotation actuation unit being coupled to the bottom surface of the rotation guide housing, facing each other with the rotation operation piece interposed therebetween, and pushing the rotation operation piece to rotate the rotation body at a predetermined angle in the left or right direction.

2. The adjustment control device for precise measurement according to claim 1, wherein the lowering control unit comprises:
    an elevation member being fixed to a bracket to which the inspection equipment is fixed, and including an elevation member having a lowering push piece on one side and an elevation guide member for guiding elevation of the elevation member, wherein the elevation member and the elevation guide member are provided with at least one or more of a rail groove and a slide bar for guiding elevation, respectively; and
a lowering actuation unit secured to the elevation member and pressing the lowering push piece while varying its length to lower the inspection equipment to the inspected object.

3. The adjustment control device for precise measurement according to claim 2, wherein the lowering control unit further comprises a first holding portion for holding the elevation member, and
wherein the first holding portion comprises:
a first coupling member secured to the elevation member, including a contact region contacting to the elevation guide member, and having a spiral hole for holding on the contact region,
a first holding member coupling to the spiral hole of the first coupling member and pressing the elevation guide member to secure the elevation member, and
a first guide member coupling the elevation guide member, and having a movement guide long hole for guiding movement of the first holding member.

4. The adjustment control device for precise measurement according to claim 1, further comprising a tilting type forward and backward control unit being disposed above the rotation control unit and controlling the rotation control unit to move the inspection equipment forward and backward while tilting the inspection equipment forward and backward on the inspected object, and
wherein the tiling type forward and backward control unit comprises:
a slide unit being mounted on a coupling plate coupled to the upper surface of the rotation control unit so as to be spaced apart from each other at a predetermined interval, including a first curved surface portion having a structure in which the center portion is depressed downward at the both edges of the upper surface, and a protruding curved rail member having a structure in which the center portion is depressed downward;
a plurality of forward and backward guide for guiding sliding to the slide unit, respectively, including a second curved surface portion being seated on the upper surface of the first curved surface portion on both ends of bottom surface and having the same curvature as the first curved surface portion, an accommodation groove for accommodating the curved rail member between the second curved surface portion, and a forward and backward push piece on one end; and
an additional forward and backward actuation unit being secured to the slide bar and pressing the forward and backward push piece while extending its length to slide the slide bar.

5. An adjustment control device for precise measurement that controls an inspection equipment for inspecting an inspected object to perform precise measurement, the device comprising:
a lowering control unit lowering the inspection equipment with respect to the inspected object;
a rotation control unit being coupled to the lowering control unit and controlling the lowering control unit to rotate the inspection equipment at a predetermined angle in left and right directions when viewed from a frontal point of view;
a forward and backward control unit being disposed above the rotation control unit and transmitting a moving force to the rotation control unit to move the inspection equipment forward or forward on the inspected object;
a tilting type forward and backward control unit being disposed above the rotation control unit and controlling the rotation control unit to move the inspection equipment forward and backward while tilting the inspection equipment forward and backward on the inspected object, and
wherein the tiling type forward and backward control unit comprises:
a slide unit being mounted on a coupling plate coupled to the upper surface of the rotation control unit so as to be spaced apart from each other at a predetermined interval, including a first curved surface portion having a structure in which the center portion is depressed downward at the both edges of the upper surface, and a protruding curved rail member having a structure in which the center portion is depressed downward;
a plurality of forward and backward guide for guiding sliding to the slide unit, respectively, including a second curved surface portion being seated on the upper surface of the first curved surface portion on both ends of bottom surface and having the same curvature as the first curved surface portion, an accommodation groove for accommodating the curved rail member between the second curved surface portion, and a forward and backward push piece on one end; and
an additional forward and backward actuation unit being secured to the slide bar and pressing the forward and backward push piece while extending its length to slide the slide bar; and
a rotating control unit for controlling the additional forward and backward actuation unit to rotate in place at a predetermined angle in the left and right directions when the inspection equipment is viewed from a planar point of view, and
wherein the rotating control unit comprises:
a rotating body secured to a first additional coupling plate coupled to the upper surface of the forward and backward guide and being capable of being rotated in place in left and right directions at a predetermined angle when viewed from a planar point of view;
a rotating operation piece coupled to one end of the rotating body and provided to operate the rotating body;
a rotating guide housing having a rotating guide groove in which the rotating body is accommodated and rotated, and a rotating long hole for allowing the rotating actuation piece to limitedly move in a horizontal direction being connected to the rotating guide groove on one surface; and
a pair of rotating control unit coupled to one surface of the rotating guide housing and facing each other with the rotating operation piece therebetween, and pushing the rotating operation piece alternately with each other to rotate the rotating body at a predetermined angle in forward or backward direction.

6. The adjustment control device for precise measurement according to claim 5, further comprising a horizontal movement control unit for controlling the rotating control unit to horizontally move the inspection equipment in left and right directions on the inspected object,
wherein the horizontal movement control unit comprises:
a horizontal movement means including a horizontal movement member secured to a second additional coupling plate being coupled to the upper surface of the rotating guide housing, and a horizontal movement guide member for guiding the movement of the horizontal movement member and for having the movement push piece on one side, wherein the horizontal movement member and the horizontal movement guide member have at least one or more of a rail groove and a slide bar for guiding movement, respectively;
a movement actuation unit coupled to the horizontal movement member and pressing the movement push piece to horizontally move the inspection equipment in right and left directions on the inspected object while varying its length.

7. The adjustment control device for precise measurement according to claim 6, wherein the horizontal movement control unit further comprises a second holding portion for holding the horizontal movement member,
wherein the second holding portion comprises:
a second coupling member secured to the horizontal movement member and having a contact region contacting the horizontal guide member, and having a spiral hole for holding on the contact region;
a second holding member being coupled to the spiral hole of the second coupling member and pressing the horizontal movement guide member to secure the horizontal movement member; and
a second guide member coupling to the horizontal movement guide member and having a movement guide long hole for guiding the movement of the second holding member movement.

8. The adjustment control device for precise measurement according to claim 6, wherein the forward and backward control unit comprises:
a forward and backward movement means including the forward and backward movement member coupled to an upper surface of the horizontal movement guide member, and a forward and backward movement guide member guiding the forward and backward movement of the forward and backward movement member while being secured to a fixed object and comprising the forward and backward movement push piece on one side, and wherein at least one of a rail groove and a slide bar for guiding forward and backward movement is formed in the forward and backward movement member and the forward and backward movement guide member, respectively; and
a forward and backward actuation unit coupling to the forward and backward movement member and pressing the forward and backward push piece while varying its length to move the inspection equipment forward and backward on the inspected object.

9. The adjustment control device for precise measurement according to claim 8, wherein the forward and backward control unit further comprises a third holding portion for holding the forward and backward movement member,
wherein the third holding portion comprises:
a third coupling member secured to the forward and backward movement member and having a contact region contacting to the forward and backward movement guide member, and having a spiral hole for holding on the contact region;
a third holding member coupling to the spiral hole of the third coupling member and pressing the forward and backward movement guide member to fix the forward and backward movement member; and
a third guide member coupling to the forward and backward movement guide member and having a movement guide long hole for guiding the movement of the third holding member.

\* \* \* \* \*